United States Patent [19]

Platzer

[11] Patent Number: 5,108,868
[45] Date of Patent: Apr. 28, 1992

[54] NEGATIVE WORKING, PEEL DEVELOPABLE, SINGLE SHEET COLOR PROOFING METHOD

[75] Inventor: Stephan J. W. Platzer, Califon, N.J.

[73] Assignee: Hoechst Celanese Corporation, Somerville, N.J.

[21] Appl. No.: 261,371

[22] Filed: Oct. 21, 1988

[51] Int. Cl.$^5$ .......................... G03F 3/00; G03F 7/016
[52] U.S. Cl. ................................... 430/143; 430/253; 430/254
[58] Field of Search ............ 430/143, 253, 254

[56] References Cited

U.S. PATENT DOCUMENTS

| | | | |
|---|---|---|---|
| 3,721,557 | 3/1973 | Inoue | 430/143 |
| 4,205,989 | 6/1980 | Moriya et al. | 430/253 |
| 4,210,711 | 7/1980 | Katajima et al. | 430/257 |
| 4,284,703 | 8/1981 | Inoue et al. | 430/253 |
| 4,334,006 | 6/1982 | Kitajima et al. | 430/253 |
| 4,347,300 | 8/1982 | Shimazu et al. | 430/253 |
| 4,489,153 | 12/1984 | Ashcraft et al. | 430/253 |
| 4,489,154 | 12/1984 | Taylor, Jr. | 430/253 |
| 4,581,308 | 4/1986 | Moriya et al. | 430/253 |
| 4,650,738 | 3/1987 | Platzer et al. | 430/143 |
| 4,656,114 | 4/1987 | Cedarberg et al. | 430/160 |

*Primary Examiner*—Charles L. Bowers, Jr.
*Attorney, Agent, or Firm*—Richard S. Roberts

[57] ABSTRACT

This invention relates to a negative-working, peel developable, single sheet color proofing method which can accurately reproduce images, using photosensitized, color constructions. The final construction is useful in predicting the image quality from a lithographic printing process.

23 Claims, No Drawings

NEGATIVE WORKING, PEEL DEVELOPABLE, SINGLE SHEET COLOR PROOFING METHOD

BACKGROUND OF THE INVENTION

In the graphic arts, it is desirable to produce a three or more color proof to assist a printer in correcting a set of color separations which will be used in exposing printing plates. The proof should reproduce the color quality that will be obtained during the printing process. The proof must be a consistent duplicate of the desired half tone or line image. Visual examination of a color proof should reveal the color rendition to be expected from press using the color separations and any defects on the separations which might need to be altered before making the printing plates.

Color proofing sheets for multicolored printing can be made by using a printing press or proof press. This requires that all of the actual printing steps be formed. However, this conventional method of color proofing is costly and time consuming.

Alternate color proofing methods have therefore been developed to simulate the quality of press proofs. There are two general types of photoimaging methods, namely the overlay type and the single sheet type.

In the overlay type of color proofing method, an independent transparent plastic support is used for producing an image of each color separation film. A number of such supports carrying colored images are then superimposed upon each other and placed on a white sheet to produce a color proof. An example of this approach is described in U.S. Pat. No. 3,136,637. The primary advantage of this method is that it is quick and can serve as a progressive proof by combining any two or more colors in register. However, this type of color proofing method has the disadvantage that the superimposed plastic supports tend to darken the color proofing sheet, and, as a result, the impression of the color proofing sheet thus prepared becomes vastly different from copies actually obtained by a conventional printing press proof.

In the single sheet type of color proofing method, a color proofing sheet is prepared by successively producing images of different colors from different color separation films onto a single receptor sheet. This is done by utilizing a single opaque support and by applying toners, photosensitive solutions, or coatings of photosensitive materials of corresponding colors on the opaque support in succession. An example of this approach is described in U.S. Pat. No. 3,671,236. An advantage of the single sheet type of color proof is that the color is not influenced by superimposed plastic supports. This method more closely resembles actual printing and eliminates the color distortion inherent in the overlay system.

Photosensitive layers can change their surface from tacky to non-tacky by incorporating photohardenable material. Colorants will adhere to the nonexposed, tacky areas and not to exposed, non-tacky areas. Such effects can be used to produce single sheet color proofing systems such as given in U.S. Pat. No. 3,649,268.

Phototackifiable diazonium salts can be used in photosensitive layers to change their surface from nontacky to tacky, as mentioned in the *Journal of Imaging Science*, 30 (1986), pp 86-89. These types of salts have been incorporated into photosensitive compositions, such as given in U.S. Pat. No. 4,334,006, for forming single images.

SUMMARY OF THE INVENTION

The present invention provides a negative-working, peel developable, single sheet color proofing method which comprises, in order:

A. providing a photosensitive article which comprises a support and a photosensitive composition layer coated on said support, said composition comprising a light sensitive diazonium salt, an organic binding resin, and a colorant, wherein said binding resin is present in sufficient amount to bind the composition components into a uniform film, and wherein said colorant is present in sufficient amount to uniformly color the composition and wherein the diazonium salt is present in sufficient amount to provide image differentiation when the composition is imagewise exposed to actinic radiation; and B. providing a substrate having at least one release surface and a thermoplastic adhesive on said release surface; and C. providing a receiver sheet having a thermoplastic adhesive disposed on at least one surface thereof, and then performing steps (D) and (E) in either order.

D. imagewise exposing said photosensitive composition to sufficient actinic radiation to provide a latent image differentiation; and E. laminating said substrate to the photosensitive layer via said thermoplastic adhesive on the substrate under heat and pressure; and F. peeling apart said support and said substrate, thereby transferring the exposed portions of the photosensitive composition to the substrate via the thermoplastic adhesive on the substrate while the nonexposed portions remain on the support; and G. laminating said exposed, peel developed portions of the photosensitive composition on the substrate with heat and pressure to said thermoplastic adhesive on the receiver sheet; and H. peeling apart said substrate and said receiver sheet, thereby transferring the exposed, peel developed portions of the photosensitive composition along with the thermoplastic adhesive of the substrate to the thermoplastic adhesive on the receiver sheet; and I. optionally repeating steps A through F at least once with another photosensitive article having a different colorant, and the exposed, peel developed portions thereof along with the thermoplastic adhesive from its substrate are transferred in a like manner to the preceding thermoplastic adhesive with its exposed, peel developed portions on the same receiver sheet.

DETAILED DESCRIPTION OF THE PREFERRED EMBODIMENT

In carrying out the method of the invention, one employs a photosensitive article which broadly comprises a support having a colored, photosensitive layer on the support surface; and a substrate having a release surface and a thermoplastic adhesive layer on said release surface; and a receiver sheet having a thermoplastic adhesive on the receiver surface.

In the preferred embodiment, the substrate and support are composed of a dimensionally and chemically stable base materials which do not significantly change their size, shape, or chemical properties as the result of the coating, drying, exposing, laminating, peeling, or other treatments which they must undergo. The material should be transparent to actinic light if exposures are made through the substrate or support. One preferred material is polyethylene terephthalate. In the usual case, it has a thickness of from about 1 to about 10 mils, a more preferred thickness is from about 2 to about 5 mils, and most preferably from about 2 to about 3 mils. Suitable films include Hostaphan 3000, available from Hoechst Celanese Corporation; Mylar D, available from DuPont; and Melinex 516, available from ICI. The surface of the material may be smooth or may be provided with a matte texture by various methods known in the art.

One can control the gloss of the final image by properly selecting the matte finish of the substrate. This effect works because the top, thermoplastic layer of the final image is originally in contact with this matte surface. Matte films include Melinex 377 and 470 from ICI. No extra steps are required to produce the desired matte finish. An additional advantage of coating on a matte surface is that subsequent transferred layers generally adhere better to a rough surface than to a smooth surface.

A similar matte finish of the final image can be obtained by embossing the top, thermoplastic surface of the final image with a matte material, such as described above. This is done by laminating together the final image and matte material under pressure and temperature. The matte material is then generally removed after lamination. The advantage of this method is that the final proof can be varied. Furthermore, the matting material can be used repeatedly.

A third method for producing a matte finish uses a heat transferable layer, such as Butvar 90, available from Monsanto, coated onto a film with a rough surface, such as Melinex 329, available from ICI. The layer is laminated to the final image under pressure and temperature. Then the film with the rough surface is peeled off. The rough surface imparts a matte finish to the final image. The advantage is that the extra layer protects the top, thermoplastic surface. U.S. Pat. Nos. 4,294,909 and 4,376,159 also suggest various methods for making a matte surface.

The substrate must have a release surface, that is, it should be capable of releasably holding the thermoplastic adhesive thereto while permitting the transfer of the exposed photosensitive layer from the support to the thermoplastic adhesive on the substrate during peel development. This may be accomplished either by the support surface being inherently releasable, being rendered releasably by a suitable treatment, or being provided with a release layer over the substrate surface.

The support must be carefully selected so that the unexposed portions of the photosensitive layer adhere to the support surface while the exposed portions are transferred to the thermoplastic adhesive on the substrate during peel development. The photosensitive layer broadly comprises a photosensitizer, a colorant, a binding resin, and other optional ingredients such as plasticizers, acid stabilizers, surfactants, antistatic compositions, uv absorbers, optical brighteners, inert fillers, and residual coating solvents.

The photosensitizer is a light sensitive, diazonium salt, preferably polymeric. The most preferred photosensitizer is the polycondensation product of 3-methoxy-4-diazo-diphenyl amine sulfate and 4,4'-bis-methoxy methyl-diphenyl ether, precipitated as mesitylene sulfonate as taught in U.S. Pat. No. 3,849,392. Other suitable photosensitizers are taught in U.S. Pat. No. 4,436,804. The diazo compounds of choice are preferable soluble in organic solvents.

Suitable binding resins include styrene/maleic anhydride copolymers, their half esters, and mixtures thereof. Such resins include Scripset 540 and 550, available from Monsanto. An important resin selection criterion is that it must release from the support and have a low enough percent elongation to tear during peel development.

The colorants useful for the present invention include various classes of dyes and pigments. Preferred colorants for this invention are pigments rather than dyes. In the most preferred embodiment, pigments having an average particle size of about 1 micrometer or less are used. Nonexclusive examples of pigments usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (73915), Hostaperm Red Violet ER (C.I. 46500), Permanent Carmine FBB (12485), Hostaperm Blue B2G (C.I. 74160), Hostaperm Blue A2R (C.I. 74160), and Printex 25. Most of these are products of Hoechst AG. They can be used separately or blended for a desired color.

Optional plasticizers which may be incorporated into the photosensitive layer include those of the phthalate and phosphate types. Preferred plasticizers include dibutyl phthalate and dimethyl phthalate. Polymeric plasticizers, such as Resoflex R-296 available from Cambridge Industries, may also be used. Acid stabilizers include phosphoric acid and p-toluene sulfonic acid.

These ingredients may be blended with such compatible solvents as methyl cellosolve, methyl ethyl ketone, and gamma-butyrolactone coated on the support, and dried. In the preferred embodiment, the photosensitive layer has a coating weight between approximately 0.1 and 5.0 g/m$^2$. The most preferred weight is from about 0.5 to 2.0 g/m$^2$.

In the preferred embodiment, the photosensitizer is present in the photosensitive layer in an amount of from about 5 to about 70 percent by weight of the layer; or more preferably from about 10 to about 35 percent by weight.

In the preferred embodiment, the colorant is present in the photosensitive layer in an amount of from about 5 to about 50 percent by weight of the layer; or more preferably from about 10 to about 40 percent by weight.

In the preferred embodiment, the binding resin is present in the photosensitive layer in an amount of from about 10 to about 80 parts by weight; or more preferably from about 20 to about 60 parts by weight.

In the preferred embodiment, the plasticizer, when one is used, is present in the photosensitive layer in an amount of up to about 20 parts by weight; or more preferably up to about 15 parts by weight and most preferably from about 12 to about 15 parts by weight.

In the preferred embodiment, the acid stabilizer, when one is used, is present in the photosensitive layer in an amount of up to about 10 parts by weight.

The invention employs a receiver sheet on which is a thermoplastic adhesive. The receiver sheet should be resistant to any adverse effects which may be caused by the lamination or peeling treatments. In particular, the receiver sheet should be dimensionally stable. Plastic, paper, or plastic coated receiver sheets are useful for this purpose. Other bases may include wood, glass, metal, and the like.

Useful plastic receiver sheets include Melinex 329; 339; 994; and 3020 from ICI. Useful plastic coated paper include polyethylene coated paper from Schoeller. Other white and nonwhite receiver sheets may also be used. Rough textured and/or adhesion promoted surfaces are preferred for the receiver, so that its thermoplastic adhesive is securely bonded to the surface of the receiver sheet. The thermoplastic adhesive may be on both sides of the receiver sheet in order to produce a doubled sided proof.

The thermoplastic adhesive on the substrate and on the receiver sheet comprises a thermoplastic polymer and may optionally contain other desired components such as optical brighteners and inert fillers. Useful thermoplastic polymers nonexclusively include acrylic polymers such as Carboset 525 available from B. F. Goodrich; vinyl acetate copolymers such as Mowilith DM-6 available from Hoechst AG; ethylene copolymers such as Elvax 40-W available from DuPont; and mixtures thereof. Vinyl acetate polymers such a Mowilith 30 and 60 available from Hoechst AG are preferred for the thermoplastic adhesive layer on the substrate. These are usually dispersed or dissolved in some suitable solvent or solvent mixture for coating on the substrate and receiver sheet. It is then dried to a coating weight of from about 3 to about 30 g/m$^2$, more preferably from about 5 to about 20 g/m$^2$. The thermoplastic adhesive layer may optionally contain a uv absorber such as Uvinul D-50 from G.A.F. It may also contain a plasticizer, such as Resoflex R-296 available from Cambridge Industries. It may also contain antistats such as Gafac and Gafstat available from GAF. It may also contain other resins, such as Nitrocellulose RS ½ available from Hercules. The adhesive layer should not be tacky to the touch during storage. The layer should be transferable in the range of from about 40° C. to about 200° C., more preferably 60° C. to 120° C. In the preferred embodiment, the polyvinyl acetate is present in the adhesive layer in an amount of greater than about 50 percent by weight. The plasticizer may be present in an amount of up to about 30 percent by weight, the uv absorber up to about 20 percent by weight, and other resins up to about 50 percent by weight.

In the preferred embodiment, the photosensitive layer is imagewise exposed by means well known in the art with emulsion-to-photosensitive layer contact. Such exposure may be conducted by exposure to a uv light source through a conventional halftone negative color separation under vacuum frame conditions. Exposure through the support gives a reversed reading image. Exposure of the photosensitive article before lamination is preferred because the diazonium salt can then absorb moisture from the air to become tacky in the exposure areas for eventual transfer to the thermoplastic adhesive on the substrate. Mercury vapor discharge lamps are preferred over metal halide lamps. Other radiation sources, such as carbon arc, pulsed xenon, and lasers, may also be used. The photosensitive layer is then laminated to the thermoplastic adhesive on the substrate.

Lamination may be conducted by putting the photosensitive layer in contact with the thermoplastic adhesive on the substrate and then introducing the two materials into the nip of a pair of heated laminating rollers under suitable pressure. Suitable lamination temperatures usually range from about 40° C. to about 200° C., preferably from about 60° C. to about 120° C. After lamination, the support and substrate are peeled away, usually merely employing manual peeling forces.

By this peeling process, an imagewise differential is caused such that the exposed portions of the photosensitive layer are transferred to the thermoplastic adhesive on the substrate while the nonexposed portions remain on the support. Next, the exposed, peel developed portions on the substrate are laminated in a like manner to the receiver sheet via its thermoplastic adhesive. The substrate is removed by peeling away the substrate from the receiver sheet. The thermoplastic adhesive from the substrate, the exposed, peel developed portions of the photosensitive layer, and the thermoplastic adhesive from the receiver sheet remain on the receiver sheet after peeling.

In the preferred embodiment, the foregoing exposure, lamination, and peeling steps are repeated three times with three additional photosensitive articles having different colorants. In the usual case, four colored layers are employed to produce a full color reproduction of a desired image. These are cyan, magenta, yellow and black. After peel development, the exposed portions along with the thermoplastic adhesive on its substrate are laminated to the thermoplastic adhesive of the preceding colored image on the receiver sheet. The substrate is then removed by peeling apart the substrate and the receiver sheet, thereby making available the thermoplastic adhesive from the last substrate for subsequent exposed portions of a different color. In this manner, a four colored reproduction can be built up on a single receiver sheet with no wet processing.

The following nonlimiting example serves to illustrate the invention.

EXAMPLE

Four photosensitive solutions of cyan, yellow, magenta, and black are produced according to photosensitive formulations described below. The pigment is introduced as a dispersion of methyl ethyl ketone, Scripset 540, and the appropriate pigment. The solutions are coated and dried separately to the required optical density onto 3 mil Melinex 516 polyester films as supports. The surface densities are roughly 1.3 g/m$^2$ for cyan, 0.9 g/m$^2$ for yellow, 1.8 g/m$^2$ for magenta, and 1.2 g/m$^2$ for black.

|  | Cyan | Yellow | Magenta | Black |
| --- | --- | --- | --- | --- |
| methyl cellosolve | 41.00 | 41.00 | 46.50 | 41.00 |
| methyl ethyl ketone | 41.00 | 40.99 | 46.48 | 41.00 |
| gamma-butyrolactone | 10.00 | 10.00 | — | 10.00 |
| dimethyl phthalate | 0.75 | 0.75 | 0.88 | 0.75 |
| dibutyl phthalate | 0.25 | 0.25 | — | 0.25 |
| p-toluene sulfonic acid | — | — | 0.18 | 0.35 |
| Scripset 540 | 3.33 | 2.60 | 3.15 | 3.71 |
| Scripset 550 | 1.17 | — | — | — |
| hydrolyzed Scripset 540 | — | — | 0.67 | — |
| SMA 2625 | — | 2.02 | — | — |
| Above diazo from U.S. Pat. No. 3,849,392 | 1.33 | 1.35 | 0.70 | 2.00 |
| phthalo blue pigment | 1.17 | — | — | — |
| yellow pigment | — | 1.04 | — | — |
| magenta pigment | — | — | 1.44 | — |
| black pigment | — | — | — | 0.94 |
| optical density | 1.1 | 0.9 | 1.2 | 1.5 |

Scripset resins are from Monsanto. SMA resins are from Arco.

The thermoplastic adhesive solution is made according to the formulation described below. The solution is coated and dried onto four 3 mil Melinex 516 polyester substrates and onto a 7 mil Melinex 3020 white polyester receiver sheet. The surface density is 12 g/m$^2$ for the substrate and 20 g/m$^2$ for the receiver sheet

| | |
|---|---|
| n-butyl acetate | 78.00 |
| Resoflex R-296 | 1.00 |
| Mowilith 30 | 21.00 |

The four photosensitive articles are imagewise exposed to actinic light through the appropriate, negative color separations, with the photosensitive layers in contact with the emulsions of the separations. The exposed, photosensitive layers are laminated at 85° C. to the substrates via the thermoplastic adhesives on the substrates. The supports for the photosensitive layers and the substrates are peeled apart, transferring the exposed portions of the cyan, yellow, magenta, and black photosensitive layers to the substrates.

The cyan exposed, peel developed portions are laminated in a similar manner to the receiver sheet via its thermoplastic adhesive. The substrate is removed by peeling away the substrate from the receiver sheet. The adhesive from the substrate, the cyan image, and the adhesive from the receiver are on the receiver in that order. The yellow exposed, peel developed portions are next laminated to the available thermoplastic adhesive attached to the cyan image on the receiver sheet. The substrate associated with the yellow image is removed from the receiver sheet. The magenta and the black are processed in a manner similar to that of yellow, giving an accurate, four color representation of the original from which the separations were prepared.

What is claimed is:

1. A color proofing method which comprises:
   A. providing a photosensitive article which comprises a support and a photosensitive composition layer coated on said support, said composition comprising a light sensitive diazonium salt, an organic binding resin, and a colorant, wherein said binding resin is present in sufficient amount to bind the composition components into a uniform film, and wherein said colorant is present in sufficient amount to uniformly color the composition and wherein the diazonium salt is present in sufficient amount to provide image differentiation when the composition is imagewise exposed to actinic radiation; and
   B. providing a substrate having at least one release surface and a thermoplastic adhesive on said release surface; and
   c. providing a receiver sheet having a thermoplastic adhesive disposed on at least one surface thereof, and then performing steps (D) and (E) in either order.
   D. Imagewise exposing said photosensitive composition to sufficient actinic radiation to provide a latent image differentiation; and
   E. laminating said substrate to the photosensitive layer via said thermoplastic adhesive on the substrate under heat and pressure; and
   F. peeling apart said support and said substrate, thereby transferring the exposed portions of the photosensitive composition to the substrate via the thermoplastic adhesive on the substrate while the nonexposed portions remain on the support; and
   G. laminating said exposed, peel developed portions of the photosensitive composition on the substrate with heat and pressure to said thermoplastic adhesive on the receiver sheet; and
   H. peeling apart said substrate and said receiver sheet, thereby transferring the exposed, peel developed portions of the photosensitive composition along with the thermoplastic adhesive of the substrate to the thermoplastic adhesive on the receiver sheet; and
   I. optionally repeating steps A, B and D through H at least once with another photosensitive article according to step A, having a different colorant, and the imagewise exposed, peel developed portions thereof along with the thermoplastic adhesive from its substrate are transferred in a like manner to the preceding thermoplastic adhesive with its exposed, peel developed portions on the same receiver sheet.

2. The method of claim 1 wherein said binding resin comprises one or more components selected from the group consisting of styrene/maleic anhydride copolymer, their half esters, and mixtures thereof.

3. The method of claim 1 wherein said colorant comprises one or more components selected from the group consisting of pigments and dyes.

4. The method of claim 1 wherein said diazonium salt comprises the polycondensation product of 3-methoxy-4-diazo-diphenyl amine sulfate and 4,4'-bismethoxy methyl-diphenyl ether, precipitated as the mesitylene sulfonate salt.

5. The method of claim 1 wherein said thermoplastic adhesive comprises polyvinyl acetate.

6. The method of claim 1 wherein said photosensitive layer further comprises one or more ingredients selected from the group consisting of plasticizers, acid stabilizers, antistatic compositions, uv absorbers, surfactants, optical brighteners, and inert fillers.

7. The method of claim 1 wherein the coating weight of the photosensitive layer ranges from about 0.1 to about 5.0 g/m$^2$.

8. The method of claim 1 wherein the photosensitizer if present in the photosensitive layer in an amount of from about 5 to about 70 percent by weight.

9. The method of claim 1 wherein the colorant is present in the photosensitive layer in an amount of from about 5 to about 50 percent by weight.

10. The method of claim 1 wherein the binding resin is present in the photosensitive layer in an amount of from about 10 to about 80 percent by weight.

11. The method of claim 6 wherein the plasticizer is present in the photosensitive layer in an amount of up to about 20 percent by weight.

12. The method of claim 6 wherein the acid stabilizer is present in the photosensitive layer in an amount of up to about 10 percent by weight.

13. The method of claim 1 wherein the adhesive layer has a coating weight of from about 3 to about 30 g/m$^2$.

14. The method of claim 1 wherein the adhesive layer further comprises one or more ingredients selected from the group consisting of uv absorbers, antistatic compositions, resins, plasticizers, and optical brighteners.

15. The method of claim 5 wherein the polyvinyl acetate is present in the adhesive layer in an amount of at least about 50 percent by weight.

16. The method of claim 1 wherein the laminating step is conducted at a temperature of from about 40° C. to abut 200° C.

17. The method of claim 1 wherein said support comprises polyethylene terephthalate.

18. The method of claim 1 wherein said receiver sheet comprises one or more components selected from the group consisting of polyethylene terephthalate and paper.

19. The method of claim 1 wherein said substrate comprises polyethylene terephthalate.

20. The method of claim 1 further comprising the substrate steps of providing a protective covering on the thermoplastic adhesive bonded to imagewise exposed portions on the receiver sheet.

21. The method of claim 1 wherein step (I) is conducted three times to produce a four-color reproduction.

22. The method of claim 21 further comprising the subsequent step of providing a protective covering on the four-color reproduction.

23. The method of claim 1 wherein said binding resin comprises styrene/maleic anhydride copolymer half ester; wherein said diazonium salt is the polycondensation product of 3-methoxy-4-diphenyl amine sulfate and 4,4'-bis-methoxy methyl-diphenyl ether precipitated as mesitylene sulfonate; wherein said thermoplastic adhesive comprises polyvinyl acetate; wherein said support and said substrate comprise polyethylene terephthalate; and wherein said receiver sheet comprises a white opaque plastic or paper material.

* * * * *